United States Patent
Yang et al.

(10) Patent No.: US 11,739,436 B2
(45) Date of Patent: Aug. 29, 2023

(54) APPARATUS AND METHOD FOR CONTINUOUS CRYSTAL PULLING

(71) Applicants: Jinko Green Energy (Shanghai) Management Co., LTD, Shanghai (CN); JINKO SOLAR CO., LTD., Jiangxi (CN)

(72) Inventors: Jun Yang, Shanghai (CN); Weize Shang, Shanghai (CN); Xiaolong Bai, Shanghai (CN)

(73) Assignees: Jinko Green Energy (Shanghai) Management Co., LTD, Shanghai (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/038,591

(22) Filed: Sep. 30, 2020

(65) Prior Publication Data

US 2022/0064815 A1 Mar. 3, 2022

(30) Foreign Application Priority Data

Aug. 28, 2020 (CN) .......................... 202010886463.8

(51) Int. Cl.
*C30B 15/00* (2006.01)
*C30B 15/02* (2006.01)
(Continued)

(52) U.S. Cl.
CPC .......... *C30B 15/002* (2013.01); *C30B 15/005* (2013.01); *C30B 15/02* (2013.01);
(Continued)

(58) Field of Classification Search
CPC ....... C30B 15/12; C30B 15/002; C30B 15/10; C30B 11/002; C30B 35/00; C30B 35/002
See application file for complete search history.

(56) References Cited

U.S. PATENT DOCUMENTS 5,720,810 A 2/1998 Arai et al.
5,795,383 A * 8/1998 Okamoto ................ C30B 15/00
117/200

(Continued)

FOREIGN PATENT DOCUMENTS

CN 105821469 A 8/2016
CN 108301038 A 7/2018
(Continued)

OTHER PUBLICATIONS

Office Action issued for Chinese Patent Application No. 202010886463. 8, dated Mar. 17, 2021 in 6 pages.
(Continued)

*Primary Examiner* — Matthew J Song
(74) *Attorney, Agent, or Firm* — Knobbe Martens Olson & Bear LLP (57) ABSTRACT

Provided is an apparatus and a method for continuous crystal pulling. The apparatus includes: a crucible including a first sub-crucible and a second sub-crucible located at inner side of the first sub-crucible; a draft tube located above the crucible; and a delivery duct supplying materials to the crucible. A ratio of inner diameter of the second sub-crucible to outer diameter of the draft tube is ≥1.05. In a first state, a distance between bottom surface of the draft tube and bottom surface of the crucible is a first distance, in a second state, a distance between bottom surface of the draft tube and bottom surface of the crucible is a second distance. The first distance is greater than the second distance. In the first and second states, a distance between a crystal-liquid interface in the crucible and the bottom surface of the draft tube remains substantially unchanged.

20 Claims, 4 Drawing Sheets

(51) Int. Cl.
  *C30B 15/12* (2006.01)
  *C30B 15/22* (2006.01)
  *C30B 29/06* (2006.01)

(52) U.S. Cl.
  CPC .............. *C30B 15/12* (2013.01); *C30B 15/22* (2013.01); *C30B 29/06* (2013.01)

(56) References Cited

U.S. PATENT DOCUMENTS

| | | | | |
|---|---|---|---|---|
| 5,900,055 | A * | 5/1999 | Nagai | C30B 15/04 117/33 |
| 6,413,310 | B1 * | 7/2002 | Tamatsuka | C30B 29/06 257/E21.321 |
| 2005/0076826 | A1 * | 4/2005 | Watanabe | C30B 15/00 117/13 |
| 2006/0236919 | A1 * | 10/2006 | Fusegawa | C30B 15/20 117/84 |
| 2007/0017433 | A1 * | 1/2007 | Sakurada | C30B 29/06 117/13 |
| 2009/0120352 | A1 * | 5/2009 | Kubota | C30B 29/06 117/13 |
| 2018/0044814 | A1 * | 2/2018 | Haringer | C30B 29/06 |
| 2018/0320287 | A1 * | 11/2018 | Zepeda | C30B 29/06 |

FOREIGN PATENT DOCUMENTS

| | | |
|---|---|---|
| EP | 0555040 A1 | 8/1993 |
| JP | H02116697 A | 5/1990 |
| JP | H08-091982 | 4/1996 |
| JP | H09183685 A | 7/1997 |
| JP | H09208367 A | 8/1997 |
| JP | 2006315869 A | 11/2006 |
| JP | 2010070404 A | 4/2010 |
| JP | 2020001977 A | 1/2020 |
| JP | 2020109052 A | 7/2020 |
| JP | 2020114802 A | 7/2020 |

OTHER PUBLICATIONS

European Search Report in European Application No. EP20198978.7, dated Feb. 3, 2021 in 8 pages.

Office Action issued for Japanese Patent Application No. 2020-162442, dated Sep. 9, 2021 in 4 pages.

\* cited by examiner

APPARATUS AND METHOD FOR CONTINUOUS CRYSTAL PULLING

CROSS-REFERENCE TO RELATED APPLICATIONS

The present application claims priority to Chinese Patent Application No. 202010886463.8, filed on Aug. 28, 2020, the content of which is incorporated herein by reference in its entirety.

TECHNICAL FIELD

The present disclosure relates to the technical field of crystal pulling and, in particular, to an apparatus and a method for continuously pulling a crystal rod.

BACKGROUND

A monocrystalline silicon (or a single crystal silicon) can be prepared using a Czochralski (CZ) method, a magnetic-field applied Czochralski (MCZ) method, a float-zone (FZ) method, or the like. The Czochralski method is widely applied to the preparation of the single crystal silicon. The traditional Czochralski process can be developed to form a higher efficient crystal pulling technique, such as a recharged Czochralski (RCZ) process or a continuous Czochralski (CCZ) process. The CCZ process can effectively reduce the preparation time, the crucible costs, and the energy consumption of the crystal pulling. Therefore, the CCZ crystal pulling process, that is, a continuous crystal pulling process, can be selected as an optimal crystal pulling technique. The CCZ crystal pulling process may achieve continuously materials feeding during the crystal pulling, and control, through a software, silicon consumed during crystal pulling that have the same mass relative to the silicon added, so as to ensure that a liquid-mouth distance may be kept substantially unchanged during the crystal pulling without lifting the crucible (the liquid-mouth distance refers to a distance from a lower edge of the draft tube to a molten silicon liquid level or a molten silicon interface). The CCZ crystal pulling process is different from an existing Czochralski monocrystalline process, which may greatly reduce the silicon melting duration, greatly increase effective equal-diameter duration in a crystal pulling cycle, and finally greatly reduce crystal pulling costs. Moreover, since feeding during crystal pulling is achieved in the CCZ crystal pulling process, a mother alloy may also be added during crystal pulling. According to a crystal pulling speed and a crystal rod diameter, a speed of adding the mother alloy is calculated to ensure that the concentration of the mother alloy in a molten silicon liquid is kept basically the same. Therefore, during the CCZ crystal pulling process, the resistivity of the crystal rod is evenly distributed. Taking an N-type monocrystal as an example, a head-tail resistivity of a monocrystalline silicon rod pulled under a crystal pulling process is about 3:1, while the head-tail resistivity of a monocrystalline silicon rod pulled under the CCZ crystal pulling process may be basically controlled to 1.1:1. The uniformity of the resistivity of the crystal rod may be of great help to the preparation of high-efficiency batteries by a subsequent battery manufacturing process.

However, due to the difficulty in the CCZ crystal pulling process, the CCZ crystal pulling process in the industry is still in a commissioning stage and has not been fully promoted at present. Commissioning of the existing CCZ crystal pulling process has a certain difficulty, leading to a relatively low yield rate under the CCZ crystal pulling process, which is mainly manifested in the following aspects: irregular edge breaking of monocrystalline rod during pulling; and after the last silicon rod is pulled, there are more residual silicon materials in the crucible, increasing costs of silicon materials. Therefore, there is a need to further improve the CCZ crystal pulling process or the apparatus thereof.

SUMMARY

An objective of the present disclosure is to provide an apparatus for continuous crystal pulling and a system for pulling a crystal rod, which may reduce fluctuation of a temperature inside a crucible caused by the adding of silicon materials during crystal pulling, make crystal pulling more stable, avoid or reduce irregular edge breaking of monocrystalline silicon rod during the crystal pulling, and also reduce the proportion of residues in the crucible and thus save crystal pulling costs.

To achieve the above objective, the technical solutions adopted in the present disclosure are as follows:

According to an aspect of the present disclosure, an apparatus for continuous crystal pulling is provided, the apparatus includes: a crucible including a first sub-crucible and a second sub-crucible located at an inner side of the first sub-crucible, and a material feeding space is formed between the first sub-crucible and the second sub-crucible; a draft tube located above the crucible; and a delivery duct disposed corresponding to the material feeding space and configured to supply materials into the crucible; wherein a ratio of an inner diameter of the second sub-crucible to an outer diameter of the draft tube is ≥1.05; in a first state, a distance between a bottom surface of the draft tube and a bottom surface of the crucible is defined as a first distance, and in a second state, a distance between the bottom surface of the draft tube and the bottom surface of the crucible is defined as a second distance, while the delivery duct is adapted to extend into the material feeding space, the first distance is greater than the second distance; and in both the first state and the second state, a distance between the bottom surface of the draft tube and a crystal-liquid interface in the crucible is kept substantially unchanged.

In an embodiment, a ratio of the inner diameter of the second sub-crucible to the outer diameter of the draft tube is in a range from 1.09 to 1.3.

In an embodiment, the draft tube includes a straight tube portion, and a gap is formed between an inner sidewall of the second sub-crucible and an outer sidewall of the straight tube portion of the draft tube with a width in a range from 50 mm to 150 mm.

In an embodiment, the outer diameter of the draft tube is in a range from 500 mm to 550 mm; and the inner diameter of the second sub-crucible is in a range from 600 mm to 650 mm, and/or an inner diameter of the first sub-crucible is in a range from 750 mm to 800 mm.

In an embodiment, a mass of materials initially fed into the crucible is designated as a first mass, a mass of residual materials in the crucible after a last crystal rod is pulled is a designated as second mass, and the second mass is 0.03 times to 0.05 times of the first mass.

In an embodiment, the delivery duct includes a straight arm portion, and a length of a portion of the straight arm portion extending into the material feeding space in the first state is less than a length of a portion of the straight arm portion extending into the material feeding space in the second state.

In an embodiment, the apparatus for continuous crystal pulling further includes a lifting mechanism, the lifting mechanism is connected to the crucible and configured to lift the crucible; and/or the lifting mechanism is connected to the draft tube and configured to lift the draft tube.

In an embodiment, the lifting mechanism includes a lifting rod and a driving portion, and one end of the lifting rod is connected to an exterior of the first sub-crucible; and the driving portion is connected to the lifting rod and configured to drive the lifting rod to move and in turn drive the crucible to move.

According to another aspect of the present disclosure, the present disclosure further provides a method for continuously pulling a crystal rod, applied to the apparatus for continuous crystal pulling as described above, the method includes: providing a first crystal liquid in the material feeding space formed between the first sub-crucible and the second sub-crucible, and providing a second crystal liquid in the second sub-crucible, wherein the second crystal liquid is used for forming a plurality of crystal rods, and the first crystal liquid in the material feeding space flows into the second sub-crucible to compensate for consumption of the second crystal liquid for forming the plurality of crystal rods; and providing a seed crystal for the second crystal liquid, and pulling the seed crystal from the second crystal liquid to form a crystal rod of the plurality of crystal rods; wherein when pulling a last one of the plurality of crystal rods, a position of the second sub-crucible and a position of the draft tube are adjusted so that a distance between an interface of the second crystal liquid in the second sub-crucible and the bottom surface of the draft tube is kept substantially unchanged.

In an embodiment, a mass of materials initially fed into the crucible is in a range from 200 kg to 300 kg.

In an embodiment, the mass of materials initially fed into the crucible is designated as a first mass, a mass of residual materials in the crucible after a last crystal rod is pulled is designated as a second mass, and the second mass is 0.03 times to 0.05 times of the first mass.

In an embodiment, a feeding speed of the materials delivered through the delivery duct is in a range from 100 g/min to 200 g/min.

In an embodiment, the delivery duct includes a straight arm portion, and a length of the straight arm portion is in a range from 180 mm to 300 mm.

In an embodiment, the outer diameter of the draft tube is in a range from 500 mm to 550 mm; and the inner diameter of the second sub-crucible is in a range from 600 mm to 650 mm, and/or an inner diameter of the first sub-crucible is in a range from 750 mm to 800 mm.

Compared with the related art, the technical solutions provided in the present application may achieve the following beneficial effects:

The apparatus for continuous crystal pulling provided in the present disclosure includes a crucible, a draft tube, and a delivery duct, wherein the crucible includes a first sub-crucible and a second sub-crucible located at an inner side of the first sub-crucible, and a ratio of an inner diameter of the second sub-crucible to an outer diameter of the draft tube is no less than 1.05. That is, the inner diameter of the second sub-crucible is greater than the outer diameter of the draft tube, so as to avoid the problem that the crucible cannot be lifted during crystal pulling and avoid the problem of interference between the second sub-crucible and the draft tube during lifting of the crucible and/or the draft tube caused by the fact that the inner diameter of the second sub-crucible and the outer diameter of the draft tube are basically the same.

Moreover, by increasing the size of the second sub-crucible and increasing an initial feeding quantity, fluctuation of the temperature in the crucible caused by the adding of silicon materials to the delivery duct during crystal pulling may be reduced, and irregular edge breaking phenomena appearing during crystal pulling may be reduced or avoided. Meanwhile, when the last crystal rod is pulled, the draft tube and/or the crucible may be lifted to adjust a relative distance between the draft tube and the crucible, and a distance between a crystal-liquid interface in the crucible and the bottom surface of the draft tube may be maintained constant, so as to reduce residual silicon materials in the crucible and thus reduce crystal pulling costs.

The method for continuously pulling a crystal rod in the present disclosure is based on the same invention concept as the apparatus for continuous crystal pulling described above, and therefore has all the characteristics and advantages of the apparatus for continuous crystal pulling described above, which will not be repeated here.

It is appreciated that, the general description above and the detailed description below are merely exemplary and shall not be interpreted as limiting the present disclosure.

BRIEF DESCRIPTION OF DRAWINGS

In order to better illustrate specific embodiments of the present disclosure or the technical solutions in the related art, the accompanying drawings used in the description of the embodiments or the related art will be introduced below. It is appreciated that, the accompanying drawings in the following description are only some embodiments of the present disclosure, and other drawings can be obtained by those of ordinary skill in the art from the provided drawings without creative work.

REFERENCE SIGNS

1—crucible; 101—first sub-crucible; 102—second sub-crucible; 112—material feeding space; 121—gap;
2—draft tube; 201—bottom surface; 202—straight tube portion;
3—delivery duct; 301—straight arm portion;
4—crystal rod;
5—crystal liquid;

6—crystal-liquid interface;
7—crystal pulling furnace;
8—lifting mechanism;
9—feeder;
10—heating device.

DESCRIPTION OF EMBODIMENTS

In order to make the objectives, technical solutions, and advantages of the present disclosure clearer, the present disclosure is described in further detail below with reference to the accompanying drawings and embodiments. It is appreciated that, specific embodiments described herein are intended only to describe the present disclosure and are not intended to limit the present disclosure.

It is appreciated that, the term "and/or" used herein is simply an association describing associated objects. It means that there may be three relationships, for example, A and/or B. It may indicate three situations: A exists alone, both A and B exist, and B exists alone.

It is appreciated that, terms such as "above" and "below" described in the embodiments of the present disclosure are described from the perspective shown in the accompanying drawings and shall not be construed as limiting the embodiments of the present disclosure. In addition, it is further appreciated that, when one element is connected "above" or "below" another element, it may be not only directly connected "above" or "below" another element, but also indirectly connected "above" or "below" the another element through an intermediate element. The singular forms "a", "an", "said", and "the" used in the embodiments of the present disclosure and the appended claims are also intended to include the plural forms thereof, unless the context clearly indicates other meanings.

If not otherwise specified, all the technical features mentioned herein may be combined with each other to form new technical solutions. Unless otherwise defined or explained, the professional and scientific terms used herein have the same meanings as those familiar to those skilled in the art.

The CCZ crystal pulling process is a continuous crystal pulling process, crystal rods produced therefrom have more uniform resistivity, narrower distribution, and higher quality. The design of a heat field in the CCZ crystal pulling process is crucial to the whole CCZ crystal pulling system or process. In the current CCZ heat field design, materials are continuously fed into the crucible through a feeding mechanism during pulling of a crystal rod, the mass of a silicon liquid (crystal liquid) consumed by growth of the crystal rod is calculated to be consistent with the mass of silicon materials added through the feeding mechanism. An outer diameter of a draft tube is basically the same as an inner diameter of an inner crucible, and the position of the crucible and the position of the draft tube remain basically unchanged during the crystal pulling. Therefore, during the CCZ crystal pulling process, although the position of the crucible remains substantially unchanged, since the mass of the consumed silicon liquid is the same as that of the added silicon materials, the position of the molten silicon interface (crystal-liquid interface) relative to the crucible will not change. Compared with the Czochralski process, the CCZ crystal pulling, due to the feeding during crystal pulling, may greatly shorten the feeding time and may greatly facilitate the uniformity of the resistivity of the crystal rod.

The CCZ crystal pulling process may greatly increase effective equal-diameter duration in a crystal pulling cycle, and the CCZ crystal pulling process may also greatly improve the uniformity of the resistivity of the crystal rod, which facilitates the subsequent battery manufacturing process. However, CCZ crystal pulling process is mainly in the commissioning stage and has not been widely used in most relevant enterprises or institutions for the following reasons: (1) the yield rate is relatively low under the CCZ crystal pulling process, which is mainly manifested in irregular edge breaking of monocrystal during drawing. In the CCZ crystal pulling process, silicon materials need to be added during pulling. When the silicon materials are added to the molten silicon liquid inside the crucible, the temperature inside the crucible may fluctuate. During the crystal pulling, the fluctuation of the temperature inside the crucible may affect the growth of monocrystal silicon, and if the temperature fluctuates greatly, edge breaking may occur in the monocrystal silicon; (2) at present, the heat field design matching the CCZ crystal pulling process determines that an ascending distance of the crucible is limited during the crystal pulling, as a result, after the last rod is pulled, more silicon materials are left in the crucible. At present, the mass of the residual silicon materials in the crucible of most manufacturers may reach more than 50 kg, and the mass of the residual silicon materials generally accounts for 50% to 60% of the initial mass of the silicon materials, which greatly increases costs of the silicon materials and makes the cost of the CCZ crystal pulling remain high.

In view of this, in order to avoid the problems of large fluctuation of a molten silicon temperature in the crucible and the relatively low yield rate caused by the adding of silicon materials during crystal pulling in a CCZ crystal pulling process, and the existing problem of an increase in crystal pulling costs caused by the fact that the mass of the residual silicon materials accounts for 50% to 60% of the initial mass of the silicon materials, an apparatus for continuous crystal pulling and a method for continuously pulling a crystal rod are provided in the present disclosure, which improve a heat field and increase an initial feeding quantity to reduce a temperature fluctuation range, weaken the temperature fluctuation caused by continuous feeding during the crystal pulling, and reduce effects of the feeding on the crystal pulling, and may reduce the proportion of the materials at the bottom of the crucible and reduce CCZ crystal pulling costs by changing a relative size of the heat field.

In a first aspect, referring to FIG. 1 to FIG. 4, an embodiment of the present disclosure provides an apparatus for continuous crystal pulling, including:

a crucible 1, the crucible 1 includes a first sub-crucible 101 and a second sub-crucible 102, the second sub-crucible 102 is located at an inner side of the first sub-crucible 101, and a material feeding space 112 is formed between the first sub-crucible 101 and the second sub-crucible 102;

a draft tube 2 located above the crucible 1, and the draft tube 2 has a bottom surface 201; and a delivery duct 3 configured to supply materials to the crucible 1, and the delivery duct 3 is disposed corresponding to the material feeding space 112, so that the materials are delivered into the material feeding space 112 through the delivery duct 3;

a ratio of an inner diameter of the second sub-crucible 102 to an outer diameter of the draft tube 2 is ≥1.05;

in a first state, a distance between the bottom surface 201 of the draft tube 2 and a bottom surface of the crucible 1 is defined as a first distance; in a second state, a distance between the bottom surface of the draft tube 2 and the bottom surface of the crucible 1 is defined as a second distance, and the first distance is greater than the second distance, while the delivery duct 3 is adapted to extend into the material feeding space 112, and a distance between a crystal-liquid interface 6 in the crucible 1 and the bottom surface 201 of the draft tube 2 remains substantially unchanged from the first state to the second state.

According to the apparatus for continuous crystal pulling, a heat field is re-designed with a large crucible and a small draft tube, so that interference from the draft tube during ascending of the crucible can be avoided, the problem of a limited lifting distance of the crucible during crystal pulling under a CCZ crystal pulling process is solved, and residual silicon materials in the crucible may be reduced, so as to solve the problem of a relatively large quantity of residues in the crucible in a CCZ process and reduce crystal pulling costs. Moreover, the heat field being designed with a large crucible and a small draft tube can increase an initial feeding quantity in the crucible during the CCZ crystal pulling process, so as to weaken the temperature fluctuation caused by feeding during the crystal pulling and greatly improve the yield rate of monocrystalline silicon rod during the CCZ crystal pulling process.

The apparatus for continuous crystal pulling described above may avoid the problem that the crucible cannot be lifted during crystal pulling and avoid the problem of interference between the second sub-crucible 102 and the draft tube 2 or a lifting distance of the crucible is limited during lifting of the crucible 1 and/or the draft tube 2 caused by the fact that the inner diameter of the second sub-crucible 102 and the outer diameter of the draft tube 2 are basically the same. In this way, during pulling of the last crystal rod 4, the draft tube 2 and/or the crucible 1 may be lifted to adjust a distance between the bottom surface 201 of the draft tube 2 and the bottom surface of the crucible 1, so that a distance between the crystal-liquid interface 6 in the crucible 1 and the bottom surface 201 of the draft tube 2 remains substantially unchanged, that is, a liquid-mouth distance is constant, so as to reduce residual silicon materials in the crucible 1 and reduce crystal pulling costs. Moreover, by use of the design of a large crucible and a small draft tube, that is, by increasing the size of the second sub-crucible 102 and increasing an initial feeding quantity, the fluctuation of the temperature in the crucible caused by the addition of silicon materials through the delivery duct 3 during crystal pulling may be reduced, which reduces or avoids irregular edge breaking occurred during crystal pulling and thus improves the yield rate of monocrystalline silicon rod.

In addition, the delivery duct 3 is configured to continuously transport materials such as silicon materials during the crystal pulling. The delivery duct 3 corresponds to the material feeding space 112 formed between the first sub-crucible 101 and the second sub-crucible 102. In a case where the distance between the bottom surface of the draft tube 2 and the bottom surface of the crucible is reduced, at least part of the delivery duct 3 may extend into the material feeding space 112, which avoids the problem that the crucible cannot be lifted due to its interference with the delivery duct 3 during lifting of the crucible 1 or when the relative position of the crucible 1 and the draft tube 2 changes.

The first sub-crucible 101 may be an outer crucible and the second sub-crucible 102 may be an inner crucible.

The ratio of the inner diameter of the second sub-crucible 102 to the outer diameter of the draft tube 2 is ≥1.05. That is, the inner diameter of the second sub-crucible 102 needs to be greater than the outer diameter of the draft tube 2. Exemplarily, the ratio of the inner diameter of the second sub-crucible 102 to the outer diameter of the draft tube 2 may be in the range from 1.05 to 1.6, in the range from 1.05 to 1.5, in the range from 1.06 to 1.4, in the range from 1.09 to 1.3, etc. Typically but non-restrictively, the ratio may be, for example, 1.05, 1.08, 1.09, 1.1, 1.15, 1.2, 1.25, 1.28, 1.3, 1.35, 1.4, 1.5, 1.6, etc. The improvement to the design of the CCZ heat field may, on the one hand, increase the inner diameter of the second sub-crucible 102 to make the inner diameter of the second sub-crucible 102 greater than the outer diameter of the draft tube 2 and, on the other hand, reduce the outer diameter of the draft tube 2 to make the inner diameter of the second sub-crucible 102 greater than the outer diameter of the draft tube 2, or increase the inner diameter of the second sub-crucible 102 and at the same time reduce the outer diameter of the draft tube 2 to make the inner diameter of the second sub-crucible 102 greater than the outer diameter of the draft tube 2. In the present disclosure, for example, the inner diameter of the second sub-crucible 102 is greater than the outer diameter of the draft tube 2 by increasing the inner diameter of the second sub-crucible 102, which can avoid the problem of interference between the second sub-crucible 102 and the draft tube 2 or a lifting distance of the crucible is limited during lifting of the crucible caused by the fact that the inner diameter of the second sub-crucible 102 and the outer diameter of the draft tube 2 are basically the same, and can increase an initial feeding quantity as well.

Figure 1:
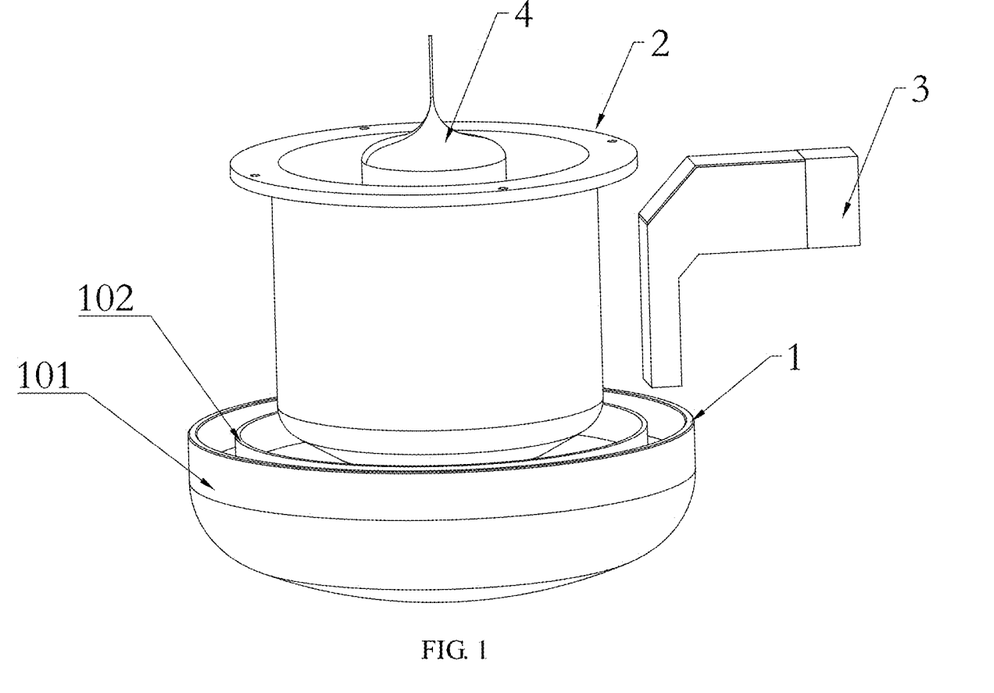
FIG. 1 is a schematic structural diagram of an apparatus for continuous crystal pulling according to an exemplary embodiment of the present disclosure.
Figure 2:
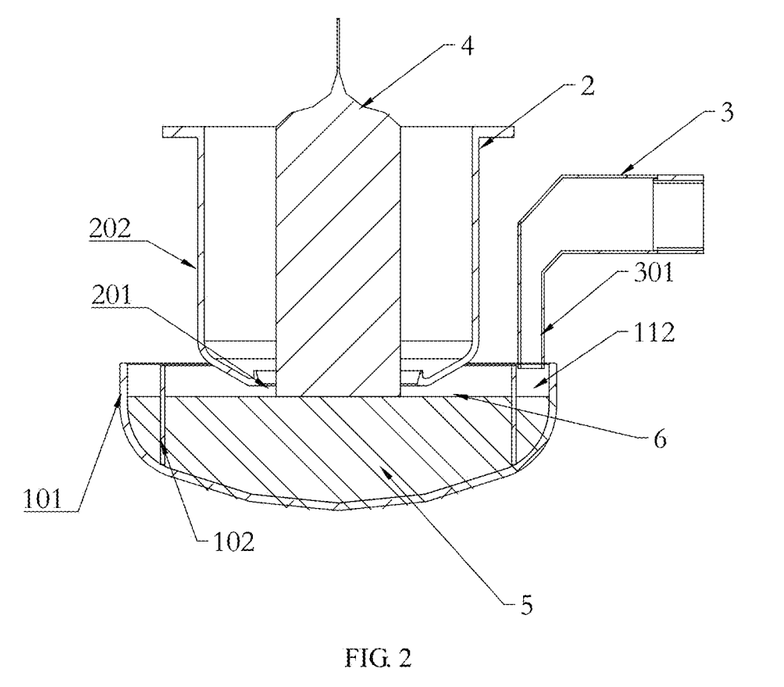
FIG. 2 is a schematic cross-sectional diagram of an apparatus for continuous crystal pulling according to an exemplary embodiment of the present disclosure.
Figure 3:
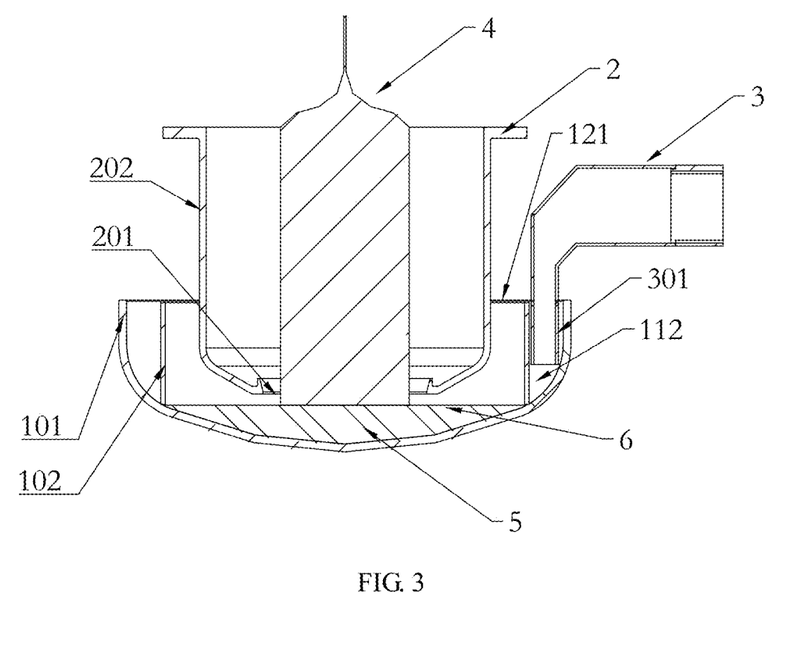
FIG. 3 is a schematic cross-sectional diagram of another apparatus for continuous crystal pulling according to an exemplary embodiment of the present disclosure.

The first state may be a state when the first crystal rod 4 is being pulled. In addition, the first state may also be a state when the second, third, or fourth crystal rod is being pulled, that is, the first state may be any state before the last crystal rod is pulled. The second state may be a state when the last crystal rod 4 is being pulled, or the second state may be a state from the beginning of pulling of the last crystal rod to the end of the pulling of the last crystal rod. When the last crystal rod 4 is pulled, a relative distance between the draft tube 2 and the crucible 1 may be changed, for example, the crucible 1 or the draft tube 2 may be lifted, so that the distance between the bottom surface 201 of the draft tube 2 and the bottom surface of the crucible 1 is shortened. Before the last crystal rod is pulled, the distance between the bottom surface 201 of the draft tube 2 and the bottom surface of the crucible 1 may be kept as the first distance all the time; during pulling of the last crystal rod, the distance between the bottom surface 201 of the draft tube 2 and the bottom surface of the crucible 1 may be adjusted to keep the liquid-mouth distance constant; after the last crystal rod is pulled, the distance between the bottom surface 201 of the draft tube 2 and the bottom surface of the crucible 1 may be minimum. The distance between the bottom surface 201 of the draft tube 2 and the bottom surface of the crucible 1 in the first state is defined as a first distance, which may be as shown in FIG. 2. The distance between the bottom surface 201 of the draft tube 2 and the bottom surface of the crucible 1 in the second state is defined as a second distance, which may be as shown in FIG. 3. It may be seen from FIG. 2 and FIG. 3 that the first distance is greater than the second distance. That is, when the last crystal rod 4 is pulled, a relative distance between the draft tube 2 and the crucible 1 may be adjusted to reduce the distance between the bottom surface 201 of the draft tube 2 and the bottom surface of the crucible 1, so as to reduce residual materials in the crucible 1, that is, reduce the mass of residues in the crucible 1, and thus reduce crystal pulling costs. Moreover, during the crystal pulling, the distance between the crystal-liquid interface 6 in the crucible 1 and the bottom surface 201 of the draft tube 2, that is, the liquid-mouth distance, needs to remain substantially unchanged in both the first state and the second state.

The crystal-liquid interface 6 may be a molten silicon interface, or an interface between a crystal liquid 5 and the current crystal rod 4, or a surface of the crystal liquid 5.

The bottom surface of the crucible 1 may be an outer bottom surface of the first sub-crucible 101.

In some embodiments, while the inner diameter of the second sub-crucible 102 is increased, the inner diameter of the first sub-crucible 101 may also be adaptively increased at the same time so as to avoid effects of the first sub-crucible 101 on the increase in the size of the second sub-crucible 102. In addition, the material feeding space 112 between the first sub-crucible 101 and the second sub-crucible 102 needs to enable the delivery duct 3 to extend into it, so the distance or size of the material feeding space 112 needs to be no less than the outer diameter of the delivery duct 3.

In some embodiments, the ratio of the inner diameter of the second sub-crucible 102 to the outer diameter of the draft tube 2 is in the range from 1.09 to 1.3, which may be, for example, 1.09, 1.0, 1.1, 1.15, 1.2, 1.22, 1.25, 1.28, 1.3, etc.

In the range, the problem of interference between the second sub-crucible 102 and the draft tube 2 or a lifting distance of the crucible is limited during lifting of the crucible caused by the fact that the inner diameter of the second sub-crucible 102 and the outer diameter of the draft tube 2 are basically the same can be avoided, so that the crucible can be lifted when the last rod is pulled, which may reduce residual silicon materials in the crucible and reduce crystal pulling costs. At the same time, an initial feeding quantity may also be increased, which reduces the fluctuation of the temperature in the crucible caused by the addition of silicon materials through the delivery duct 3 during crystal pulling, reduces or avoids irregular edge breaking during the crystal pulling, and then improves the yield rate of the monocrystalline silicon rod.

In some embodiments, the draft tube 2 includes a straight tube portion 202. There is a gap 121 between an inner sidewall of the second sub-crucible 102 and an outer sidewall of the straight tube portion 202 of the draft tube 2. A distance of the gap 121 is in the range from 50 mm to 150 mm, which may further in the range from 50 mm to 120 mm, and further in the range from 60 mm to 100 mm Typically but non-restrictively, the distance may be, for example, 50 mm, 60 mm, 70 mm, 80 mm, 90 mm, 100 mm, 120 mm, 140 mm, 150 mm, etc.

The draft tube 2 may include a straight tube portion 202 or a non-straight tube portion. The non-straight tube portion may be, for example, a portion having a cambered surface. The outer diameter of the draft tube 2 refers to an outer diameter of the straight tube portion 202 of the draft tube 2.

There may have various types of shapes of the draft tube 2, the shape shown in FIG. 1 to FIG. 4 may be adopted, and other shapes may also be adopted in other embodiments, which is not limited in the present disclosure.

When the last rod is pulled, the relative position between the draft tube 2 and the crucible 1 may be changed to shorten the distance between the bottom surface 201 of the draft tube 2 and the bottom surface of the crucible 1, so as to reduce residual silicon materials in the crucible 1. To avoid interference between the draft tube 2 and the second sub-crucible 102 during lifting, the gap 121 between them may be within an appropriate range, which helps to reduce costs and avoid interference.

In some embodiments, the outer diameter of the draft tube 2 is in the range from 500 mm to 550 mm Typically but non-restrictively, the outer diameter may be, for example, 500 mm, 510 mm, 520 mm, 530 mm, 540 mm, 550 mm, etc.

The inner diameter of the second sub-crucible 102 is in the range from 600 mm to 650 mm Typically but non-restrictively, the inner diameter may be, for example, 600 mm, 610 mm, 620 mm, 630 mm, 640 mm, 650 mm, etc.

The inner diameter of the first sub-crucible 101 is in the range from 750 mm to 800 mm Typically but non-restrictively, the inner diameter may be, for example, 750 mm, 760 mm, 770 mm, 780 mm, 790 mm, 800 mm, etc.

There may have various types of shapes of the first sub-crucible 101 and the second sub-crucible 102, which are not limited in the present disclosure. Exemplarily, in some embodiments, the second sub-crucible 102 may be a cylindrical quartz crucible disposed inside the first sub-crucible 101, the second sub-crucible 102 includes a vertical portion, the second sub-crucible 102 and the first sub-crucible 101 may have a common bottom, and a lower part of the second sub-crucible 102 is provided with a connecting port for the melt flow. In some other embodiments, the second sub-crucible 102 may be a U-shaped crucible disposed on an inner side of the first sub-crucible 101, the first sub-crucible 101 and the second sub-crucible 102 each may be provided with a curved bottom and a vertical part, and the bottom of the second sub-crucible 102 is provided with a number of through holes for the silicon melt flow.

Optionally, an inner surface of the first sub-crucible 101 and/or an inner surface of the second sub-crucible 102 may be provided with a coating, which may be, for example, a transparent silicon oxide glass layer, and may play a role of strengthening the crucible.

In some embodiments, the mass of materials initially fed into the crucible 1 is defined as a first mass, the mass of residual materials in the crucible 1 after the end of pulling of the last crystal rod 4 is defined as a second mass, and the second mass is 0.03 times to 0.05 times of the first mass, which may be, for example, 0.03 times, 0.04 times, 0.05 times, etc.

Thus, the residual silicon materials in the crucible may be greatly reduced and the crystal pulling costs may be reduced.

In some embodiments, the delivery duct 3 includes a straight arm portion 301, and a length of the straight arm portion 301 extending into the material feeding space 112 in the first state is less than a length of the straight arm portion 301 extending into the material feeding space 112 in the second state.

In the first state, an outlet of the delivery duct 3 may correspond to an opening of the material feeding space 112, or a small part of a lower end of the straight arm portion 301 of the delivery duct 3 may extend into the material feeding space 112. In the second state, the straight arm portion 301 of the delivery duct 3 may further extend into the material feeding space 112. That is, when the last crystal rod 4 is pulled, the crucible may be lifted, and in order to avoid effects of the delivery duct 3 on lifting of the crucible 1, the length of the straight arm portion 301 of the delivery duct 3 may be increased so that the length of the straight arm portion 301 extending into the material feeding space 112 is greater when the last crystal rod 4 is pulled, which may thus ensure that there may be no interference with the delivery duct 3 during lifting of the crucible 1, thereby avoiding the problem that the crucible 1 cannot be lifted.

In some embodiments, the length of the straight arm portion 301 is in the range from 180 mm to 300 mm. Typically but non-restrictively, the length may be, for example, 180 mm, 190 mm, 200 mm, 220 mm, 240 mm, 250 mm, 260 mm, 270 mm, 280 mm, etc.

The length of the straight arm portion 301 of the delivery duct 3 is increased to make the length of the straight arm portion 301 in the range of 180 mm to 300 mm, which may thus ensure that there may be no interference with the delivery duct 3 during lifting of the crucible 1, thereby avoiding the problem that the crucible 1 cannot be lifted.

In order to shorten the distance between the bottom surface 201 of the draft tube 2 and the bottom surface of the crucible 1, reduce residual silicon materials in the crucible 1, and lift the crucible 1 or the draft tube 2 when the last crystal rod 4 is pulled, a lifting mechanism capable of lifting the crucible 1 or the draft tube 2 needs to be provided. In some embodiments, the apparatus for continuous crystal pulling further includes a lifting mechanism 8. The lifting mechanism 8 is connected to the crucible 1 and configured to lift the crucible 1; and/or lifting mechanism 8 is connected to the draft tube 2 and configured to lift the draft tube 2.

The apparatus for continuous crystal pulling may be provided with a lifting mechanism 8. The lifting mechanism 8 may be connected to the draft tube 2 and configured to lift the draft tube 2, or the lifting mechanism 8 may be connected to the crucible 1 and used to lift the crucible 1, or the lifting mechanism may be connected to both the crucible 1 and the draft tube 2 and configured to lift both the crucible 1 and the draft tube 2.

The lifting mechanism configured to lift the draft tube may be of various types, which may be, for example, a variety of well-known lifting mechanisms. The lifting mechanism is not limited in the present disclosure, and will not be described in detail here.

In some embodiments, the lifting mechanism 8 includes a lifting rod and a driving portion, and one end of the lifting rod is connected to the outside of the first sub-crucible 101; and the driving portion is connected to the lifting rod and configured to drive the lifting rod to move and thus drive the crucible 1 to move.

Optionally, the driving portion may be a motor. The motor is configured to drive the lifting rod and drive the crucible 1 up or down, which is simple in structure, low-cost, and easy to operate.

In some embodiments, the apparatus for continuous crystal pulling may further be provided with a distance sensor, a temperature sensor, a control unit, etc. The temperature sensor and the distance sensor are connected to the control unit respectively. The temperature sensor may be configured to monitor a temperature during crystal pulling. The distance sensor may be configured to monitor a distance between the crystal-liquid interface 6 in the crucible 1 and the bottom surface 201 of the draft tube 2, ensuring that the distance between the crystal-liquid interface 6 in the crucible 1 and the bottom surface 201 of the draft tube 2 keeps substantially unchanged during the crystal pulling.

Figure 4:
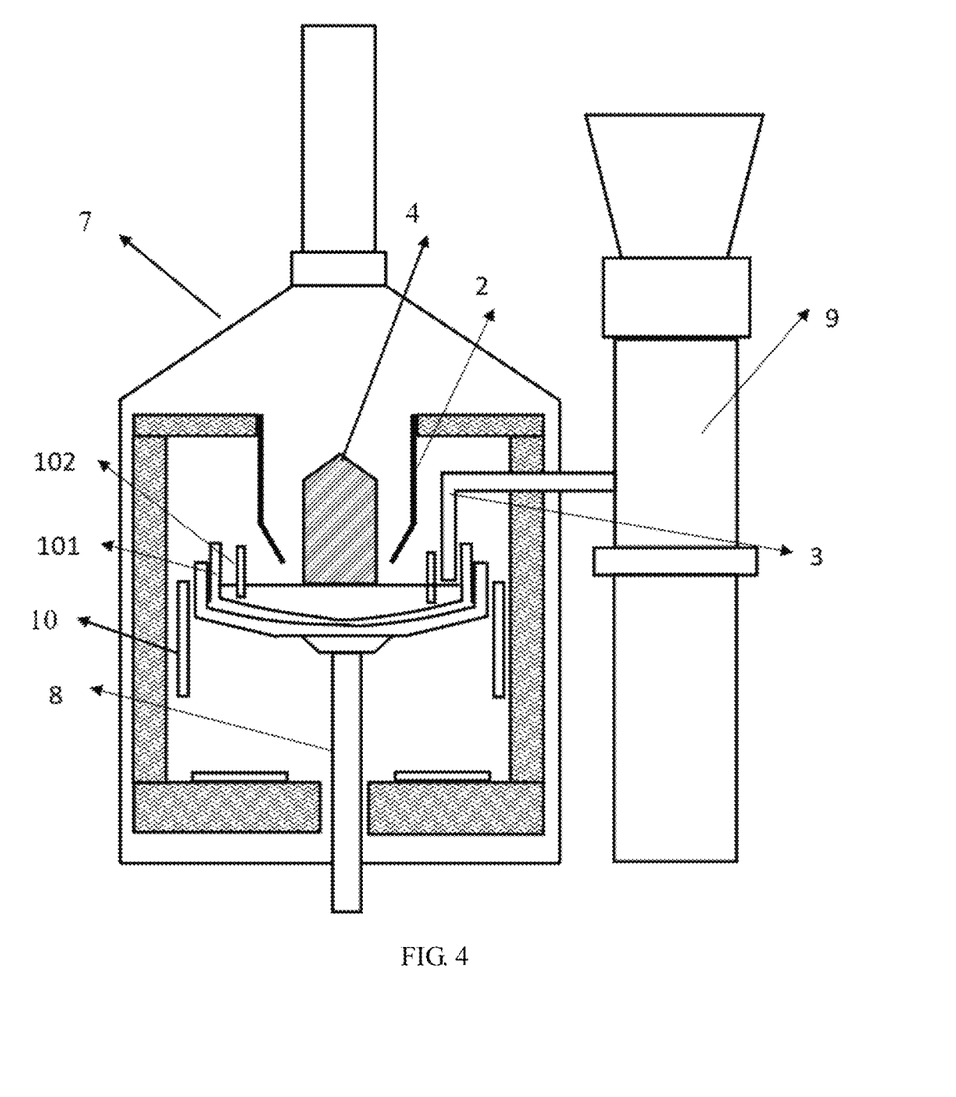
FIG. 4 is a schematic structural diagram of another apparatus for continuous crystal pulling according to an exemplary embodiment of the present disclosure.

In some embodiments, as shown in FIG. 4, the apparatus for continuous crystal pulling is provided with a crystal pulling furnace 7, and the crucible 1, the draft tube 2, and at least part of the delivery duct 3 are disposed in the crystal pulling furnace 7.

Further, the lifting rod may also be at least partially disposed in the crystal pulling furnace 7, and the driving portion, for example, the motor, may be disposed outside the crystal pulling furnace 7.

Further, the crystal pulling furnace 7 is further provided with a heating device 10 configured to heat the crucible 1.

Further, the apparatus for continuous crystal pulling further includes a feeder 9, one end of the delivery duct 3 is disposed corresponding to the material feeding space 112, and the other end of the delivery duct 3 is connected to the feeder 9.

It is appreciated that, in the above apparatus for continuous crystal pulling, the parts that are not described in detail, such as the control unit, the heating device, the feeder or other thermal insulation structures, may be selected and set according to actual situations, which are not specially limited and not repeated here.

It can be known from the above that the present disclosure achieves the objective of increasing an initial feeding quantity by optimizing the design of the heat field, and reduces effects of temperature fluctuation caused by the adding of silicon materials during the crystal pulling. Moreover, the crucible has a large lifting space. When the last crystal rod is pulled, the problem of a large quantity of residues in the crucible may be solved by lifting the crucible.

In a second aspect, an embodiment of the present disclosure further provides a method for continuously pulling a crystal rod applied to the apparatus for continuous crystal pulling described above, which includes:

providing a first crystal liquid in the material feeding space formed between the first sub-crucible and the second sub-crucible, and providing a second crystal liquid in the second sub-crucible, the second crystal liquid is used for forming a plurality of crystal rods by pulling, and the first crystal liquid in the material feeding space flowing into the second sub-crucible to compensate for consumption of the second crystal liquid caused by the pulling of the plurality of crystal rods; and providing a seed crystal for the second crystal liquid, and pulling the seed crystal from the second crystal liquid to grow the crystal rod;

when pulling the last one of the plurality of crystal rods, a position of the second sub-crucible and/or a position of the draft tube are/is adjusted so that a distance between an interface of the second crystal liquid (crystal-liquid interface) in the second sub-crucible and the bottom surface of the draft tube is maintained constant.

The method for continuously pulling a crystal rod is different from the CCZ crystal pulling process mainly in that, in the CCZ crystal pulling process, the position of the crucible or the draft tube cannot be adjusted when the last crystal rod is pulled, leading to a relatively large quantity of residues in the crucible and an increase in costs; while in the present disclosure, the position of the second sub-crucible and/or the position of the draft tube may be adjusted by re-designing the CCZ heat field when the last one of the plurality of crystal rods is pulled, which reduces the quantity of residues in the crucible and keeps a distance between an interface of the second crystal liquid in the second sub-crucible, that is, the crystal-liquid interface in the crucible, and the bottom surface of the draft tube substantially unchanged. At the same time, the present disclosure increases a size ratio of the second sub-crucible to the draft tube, which may increase the initial feeding quantity, reduce or avoid irregular edge breaking of monocrystalline silicon rod, and improve the yield rate.

It is appreciated that, before the last crystal rod is pulled, materials may be delivered into the crucible through the delivery duct to supplement the consumed second crystal liquid and keep the distance between the crystal-liquid interface in the crucible and the bottom surface of the draft tube substantially unchanged; when the last crystal rod is pulled, by stopping transporting the materials into the crucible through the delivery duct and by lifting the crucible, a relative distance between the crucible and the draft tube may be adjusted, and the distance between the crystal-liquid interface in the crucible and the bottom surface of the draft tube is kept substantially unchanged. It could be appreciated by those skilled in the art that the method for continuously pulling a crystal rod is based on the same invention concept as the apparatus for continuous crystal pulling described above, and the characteristics and advantages described for the apparatus for continuous crystal pulling are also applicable to the method for continuously pulling a crystal rod, which will not be repeated here.

Optionally, the mass of the materials initially fed into the crucible is in the range from 200 kg to 300 kg.

The inventor finds that the larger the initial feeding quantity of the crucible, the smaller the temperature fluctuation caused by the same feeding speed during the CCZ crystal pulling process. By optimizing the design of the first sub-crucible, the second sub-crucible, the delivery duct and the draft tube, the crystal pulling may be made more stable during growth of the CCZ crystal pulling process and the proportion of residues in the crucible may be greatly reduced.

Optionally, the mass of materials initially fed into the crucible is defined as a first mass, the mass of residual materials in the crucible after the last crystal rod is pulled is defined as a second mass, and the second mass is 0.03 times to 0.05 times of the first mass.

Optionally, a feeding speed of the materials delivered through the delivery duct is in the range from 100 g/min to 200 g/min.

Optionally, the delivery duct includes a straight arm portion, and a length of the straight arm portion is in the range from 180 mm to 300 mm.

Optionally, the outer diameter of the draft tube is in the range from 500 mm to 550 mm; and the inner diameter of the second sub-crucible is in the range from 600 mm to 650 mm, and/or an inner diameter of the first sub-crucible is in the range from 750 mm to 800 mm.

In order to facilitate the understanding of the present disclosure, the present disclosure is further described below with reference to illustrative examples and comparative examples.

Example 1

As shown in FIG. 1 to FIG. 4, an apparatus for continuous crystal pulling includes a crucible 1, a draft tube 2, a delivery duct 3, and a lifting mechanism 8. The crucible 1 includes a first sub-crucible 101 and a second sub-crucible 102, the second sub-crucible 102 is located at an inner side of the first sub-crucible 101, and a material feeding space 112 is formed between the first sub-crucible 101 and the second sub-crucible 102. The draft tube 2 is located above the crucible 1, and the draft tube 2 has a bottom surface 201. The delivery duct 3 is configured to supply materials to the crucible 1, and the delivery duct 3 is disposed corresponding to the material feeding space 112. The lifting mechanism 8 includes a lifting rod and a driving portion, and one end of the lifting rod is connected to the outside of the first sub-crucible 101, and the driving portion is connected to the lifting rod and configured to drive the lifting rod to move and thus drive the crucible 1 to move.

An inner diameter of the first sub-crucible 101 is in the range from 750 mm to 800 mm, an inner diameter of the second sub-crucible 102 is in the range from 600 mm to 650 mm, and an outer diameter of the draft tube 2 is in the range from 500 mm to 550 mm.

The delivery duct 3 includes a straight arm portion 301, and a length of the straight arm portion 301 is in the range from 180 mm to 300 mm. This may prevent that the crucible 1 cannot be lifted caused by the delivery duct 3.

An initial feeding quantity in Embodiment 1 is in the range from 200 kg to 300 kg. A growth speed of the crystal rod 4 is basically the same as those in the normal cases. A speed of feeding through the delivery duct 3 may be set to about 100 g/min to 200 g/min.

When the last crystal rod 4 is pulled, the crucible 1 may be lifted up by using the lifting mechanism 8 to shorten a distance between the bottom surface of the draft tube 2 and a bottom surface of the crucible 1. Considering the crystal pulling process and production capacity, after completion of the crystal pulling, the mass of the residual silicon liquid in the crucible 1 is about 10 kg. In addition, when the last crystal rod 4 is pulled, in order to ensure that a distance between the bottom surface 201 of the draft tube 2 and a crystal-liquid interface 6 in the crucible 1 remains substantially unchanged, the crucible 1 needs to be lifted in the crystal pulling process, and a height difference between a height of the initial feeding quantity in the crucible 1 and a height of the residual silicon liquid in the crucible 1 after the last rod is pulled is the height to which the crucible 1 needs to be lifted.

Comparative Example 1

Figure 5:
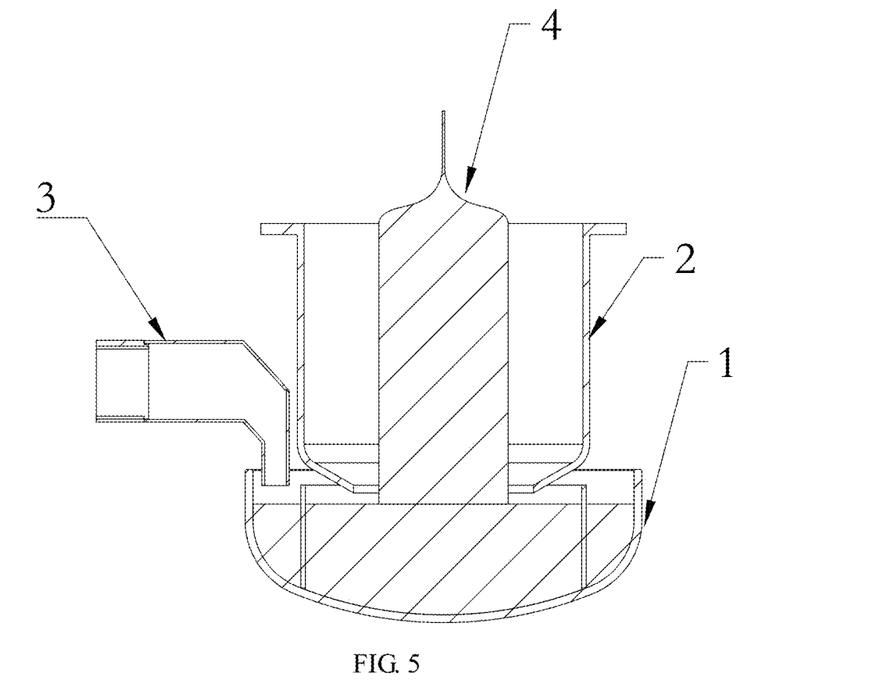
FIG. 5 is a schematic structural diagram of an apparatus for continuous crystal pulling in Comparative Example 1.

As shown in FIG. 5, an apparatus for continuous crystal pulling includes a crucible 1, a draft tube 2, and a delivery duct 3. The crucible 1 includes a first sub-crucible and a second sub-crucible, the second sub-crucible is located at an inner side of the first sub-crucible, and a material feeding space is formed between the first sub-crucible and the second sub-crucible. The draft tube 2 is located above the crucible 1, and the draft tube 2 has a bottom surface. The delivery duct 3 is configured to supply materials to the crucible 1, and the delivery duct 3 is disposed corresponding to the material feeding space.

An inner diameter of the first sub-crucible is in the range from 650 mm to 700 mm, an inner diameter of the second sub-crucible is in the range from 470 mm to 520 mm, and an outer diameter of the draft tube 2 is in the range from 500 mm to 550 mm. In Comparative Example 1, since the inner diameter of the second sub-crucible is smaller than the outer diameter of the draft tube 2 or the inner diameter of the second sub-crucible is basically the same as the outer diameter of the draft tube 2, the crucible cannot be lifted up during crystal pulling, otherwise the crucible may interfere with the draft tube 2.

The delivery duct 3 includes a straight arm portion, and a length of the straight arm portion is in the range from 40 mm to 60 mm.

An initial feeding quantity in Comparative Example 1 is in the range from 80 kg and 150 kg, and when a CCZ crystal pulling process is adopted, a crystal pulling speed and a feeding speed are controlled to ensure that a molten silicon liquid surface, i.e., a crystal-liquid interface, remains substantially unchanged relative to the crucible. Therefore, when the last crystal rod 4 is pulled, residual silicon materials in the crucible is up to 40 kg to 90 kg. Since the second sub-crucible and the draft tube in Comparative Example 1 are basically the same in size, the crucible cannot be lifted up when the last rod is pulled, so that there are more materials left at the bottom of the crucible, resulting in a waste.

It can be seen from analysis and comparison between Embodiment 1 and Comparative Example 1 that in the CCZ heat field in the present disclosure, radial sizes of an inner crucible and an outer crucible are increased without changing the size of the draft tube 2, there is a sufficient amount of clearance between an outer diameter of the draft tube 2 and an inner diameter of the inner crucible, and the size of the delivery duct 3 (or feeding box) is optimized so that the crucible has a relatively large lifting space when the last crystal rod 4 is pulled. Therefore, when the last rod is pulled, the crucible may be lifted up, which finally greatly reduces the mass of residual materials in the crucible and reduces CCZ crystal pulling costs.

Figure 6:
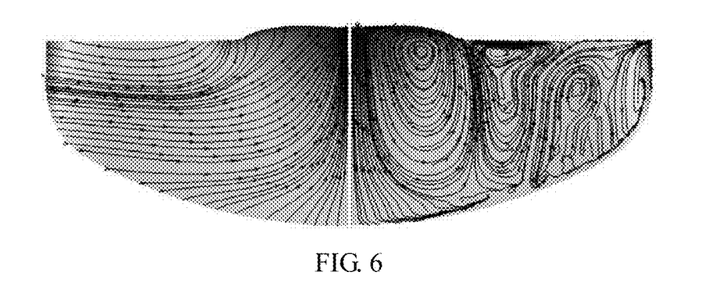
FIG. 6 is a schematic simulation diagram of a crystal rod obtained by using an apparatus for continuous crystal pulling in Embodiment 1 of the present disclosure.
Figure 7:
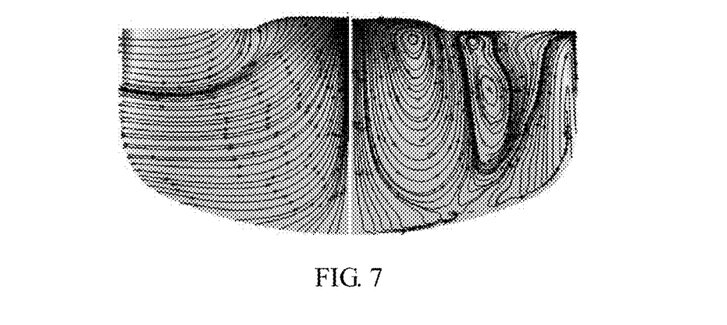
FIG. 7 is a schematic simulation diagram of a crystal rod obtained by using the apparatus for continuous crystal pulling in Comparative Example 1.

The lengths of the crystal rods shown in FIG. 6 and FIG. 7 are both 1300 mm, but the inner diameter of the crucible used in FIG. 6 is greater than that used in FIG. 7. As shown in FIG. 6 and FIG. 7 respectively, the inventor draws the following conclusion through CGsim simulation software: as the inner diameter of the crucible increases, shear flow on a melt surface and capillary convection in a melt are significantly strengthened, which enhances the oxygen loss, and buoyancy driven convection on a side of the crucible is almost isolated from mechanical convection in the center, and the chance of oxygen from the wall of the crucible entering a crystal growth interface is greatly reduced. Therefore, the quality of the crystal rod may be improved by increasing the inner diameter of the crucible. Besides, a loading quantity is increased by increasing the inner diameter of the crucible. Under the same feeding speed, the larger the initial feeding quantity, the lower the temperature fluctuation range. Therefore, by optimizing the heat field design and increasing the initial feeding quantity, the temperature fluctuation inside the crucible is be weakened when the feeding speed is substantially unchanged, so that the crystal growth is more stable.

Based on the above descriptions, irregular edge breaking of the monocrystalling silicon rod and a relatively large quantity of residues in the crucible are main problems existed during CCZ crystal pulling at preset. The irregular edge breaking of the monocrystalling silicon rod may lead to a relatively low crystallinity rate and a low man-hour utilization rate of a furnace under the CCZ crystal pulling process. The relatively large quantity of residues in the crucible leads to a waste of silicon materials and increases crystal pulling costs. In the present disclosure, through the optimized design of the heat field and under the corresponding design of the first sub-crucible 101, the second sub-crucible 102, the draft tube 2 and the delivery duct 3, the initial feeding quantity of the crucible is increased, and the temperature fluctuation caused by adding of solid silicon materials during crystal pulling is reduced, so that the crystal growth is more stable. Moreover, when the last rod is pulled, the crucible has a certain lifting space so that the silicon materials in the crucible may be fully used as far as possible without changing the liquid-mouth distance (i.e., the distance from the bottom surface 201 of the draft tube 2 to the crystal-liquid interface) remains substantially unchanged, thereby reducing the waste and costs.

The above are merely embodiments of the present disclosure and are not intended to limit the present disclosure. The present disclosure may be subject to changes and variations for those skilled in the art. Any modification, equivalent replacement, and improvement made within the spirit and principles of the present disclosure shall all be encompassed in the protection scope of the present disclosure.

It should be noted that part of the patent application document contains copyrighted content. The copyright owner retains the copyright except by making a copy of the contents of the patent file or the patent document recorded by the Patent Office.

What is claimed is:

1. An apparatus for continuous crystal pulling, comprising:
    a crucible including a first sub-crucible and a second sub-crucible located at an inner side of the first sub-crucible, wherein a material feeding space is formed between the first sub-crucible and the second sub-crucible;
    a draft tube located above the crucible; and
    a delivery duct disposed corresponding to the material feeding space and configured to supply materials into the crucible;
    wherein a ratio of an inner diameter of the second sub-crucible to an outer diameter of the draft tube is in a range from 1.09 to 1.3, the outer diameter of the draft tube is in a range from 500 mm to 550 mm, and the inner diameter of the second sub-crucible is in a range from 600 mm to 650 mm,
    wherein the draft tube is capable of moving between a first position and a second position, in the first position, a distance between a bottom surface of the draft tube and a bottom surface of the crucible is designated as a first distance, and in the second position, a distance between the bottom surface of the draft tube and the bottom surface of the crucible is designated as a second distance while the delivery duct is adapted to extend into the material feeding space, the first distance is greater than the second distance,
    wherein in both the first position and the second position, a distance between the bottom surface of the draft tube and a crystal-liquid interface in the crucible is kept substantially unchanged, and
    wherein the draft tube comprises a straight tube portion, and a gap is formed between an inner sidewall of the second sub-crucible and an outer sidewall of the straight tube portion of the draft tube with a width in a range from 50 mm to 150 mm.

2. The apparatus for continuous crystal pulling according to claim 1, wherein the outer diameter of the draft tube is in a range from 500 mm to 550 mm; and
    an inner diameter of the first sub-crucible is in a range from 750 mm to 800 mm.

3. The apparatus for continuous crystal pulling according to claim 1, wherein a mass of materials initially fed into the crucible is designated as a first mass, a mass of residual materials in the crucible after a last crystal rod is pulled is designated as a second mass, and the second mass is 0.03 times to 0.05 times of the first mass.

4. The apparatus for continuous crystal pulling according to claim 1, wherein the delivery duct comprises a straight arm portion vertically extendable into the material feeding space.

5. The apparatus for continuous crystal pulling according to claim 4, wherein a length of the straight arm portion is in a range from 180 mm to 300 mm.

6. The apparatus for continuous crystal pulling according to claim 4, wherein a length of a portion of the straight arm portion extending into the material feeding space when the draft tube is in the first position is less than a length of a portion of the straight arm portion extending into the material feeding space when the draft tube is in the second position.

7. The apparatus for continuous crystal pulling according to claim 1, further comprising a lifting mechanism connected to the crucible and configured to lift the crucible.

8. The apparatus for continuous crystal pulling according to claim 7, wherein the lifting mechanism comprises a lifting rod and a driving portion, and one end of the lifting rod is connected to an exterior of the first sub-crucible; and the driving portion is connected to the lifting rod and configured to drive the lifting rod to move and in turn drive the crucible to move.

9. The apparatus for continuous crystal pulling according to claim 8, further comprising:

a crystal pulling furnace, in which the crucible, the draft tube, and at least a part of the delivery duct are disposed, wherein the lifting rod is at least partially disposed in the crystal pulling furnace, and the driving portion is disposed outside the crystal pulling furnace.

10. The apparatus for continuous crystal pulling according to claim 1, further comprising a lifting mechanism connected to the draft tube and configured to lift the draft tube.

11. The apparatus for continuous crystal pulling according to claim 1, further comprising:

a distance sensor configured to monitor a distance between the crystal-liquid interface in the crucible and the bottom surface of the draft tube;

a temperature sensor configured to monitor a temperature during crystal pulling; and a control unit connected to the distance sensor and the temperature sensor and configured to control operation of the apparatus.

12. The apparatus for continuous crystal pulling according to claim 1, further comprising:

a feeder, wherein one end of the delivery duct is opening into the material feeding space, and an other end of the delivery duct is connected to the feeder; and a heating device configured to heat the crucible.

13. A method for continuously pulling a crystal rod, applied to an apparatus for continuous crystal pulling, the method comprising:

providing an apparatus for continuous crystal pulling, wherein the apparatus includes:

a crucible including a first sub-crucible and a second sub-crucible located at an inner side of the first sub-crucible, wherein a material feeding space is formed between the first sub-crucible and the second sub-crucible;

a draft tube located above the crucible; and a delivery duct disposed corresponding to the material feeding space and configured to supply materials into the crucible;

providing a first crystal liquid in the material feeding space formed between the first sub-crucible and the second sub-crucible, and providing a second crystal liquid in the second sub-crucible, wherein the second crystal liquid is used for forming a plurality of crystal rods, and the first crystal liquid in the material feeding space flows into the second sub-crucible to compensate for consumption of the second crystal liquid for forming the plurality of crystal rods; and providing a seed crystal for the second crystal liquid, and pulling the seed crystal from the second crystal liquid to form a crystal rod of the plurality of crystal rods, wherein when pulling a last one of the plurality of crystal rods, a position of the second sub-crucible and a position of the draft tube are adjusted so that a distance between an interface of the second crystal liquid in the second sub-crucible and a bottom surface of the draft tube is kept substantially unchanged, wherein the apparatus comprises:

a crucible including a first sub-crucible and a second sub-crucible located at an inner side of the first sub-crucible, wherein a material feeding space is formed between the first sub-crucible and the second sub-crucible;

a draft tube located above the crucible; and a delivery duct disposed corresponding to the material feeding space and configured to supply materials into the crucible;

wherein a ratio of an inner diameter of the second sub-crucible to an outer diameter of the draft tube is in a range from 1.09 to 1.3, the outer diameter of the draft tube is in a range from 500 mm to 550 mm, and the inner diameter of the second sub-crucible is in a range from 600 mm to 650 mm, wherein the draft tube is capable of moving between a first position and a second position, in the first position, a distance between a bottom surface of the draft tube and a bottom surface of the crucible is designated as a first distance, and in the second position, a distance between the bottom surface of the draft tube and the bottom surface of the crucible is designated as a second distance while the delivery duct is adapted to extend into the material feeding space, the first distance is greater than the second distance, wherein in both the first position and the second position, a distance between the bottom surface of the draft tube and a crystal-liquid interface in the crucible is kept substantially unchanged, and wherein the draft tube comprises a straight tube portion, and a gap is formed between an inner sidewall of the second sub-crucible and an outer sidewall of the straight tube portion of the draft tube with a width in a range from 50 mm to 150 mm.

14. The method for continuously pulling a crystal rod according to claim 13, wherein a mass of materials initially fed into the crucible is in a range from 200 kg to 300 kg.

15. The method for continuously pulling a crystal rod according to claim 14, wherein the mass of materials initially fed into the crucible is designated as a first mass, a mass of residual materials in the crucible after a last crystal rod is pulled is designated as a second mass, and the second mass is 0.03 times to 0.05 times of the first mass.

16. The method for continuously pulling a crystal rod according to claim 13, wherein a feeding speed of the materials delivered through the delivery duct is in a range from 100 g/min to 200 g/min.

17. The method for continuously pulling a crystal rod according to claim 13, wherein the delivery duct comprises a straight arm portion, and a length of the straight arm portion is in a range from 180 mm to 300 mm.

18. The method for continuously pulling a crystal rod according to claim 13, wherein the outer diameter of the draft tube is in a range from 500 mm to 550 mm, and an inner diameter of the first sub-crucible is in a range from 750 mm to 800 mm.

19. The method for continuously pulling a crystal rod according to claim 13, wherein the apparatus further comprises a lifting mechanism connected to the crucible, and the method further comprises:

lifting the crucible by the lifting mechanism during pulling the plurality of crystal rods to adjust a distance between the crucible and the draft tube.

20. The method for continuously pulling a crystal rod according to claim 13, wherein the apparatus further comprises a lifting mechanism connected to the draft tube, and the method further comprises:

lifting the draft tube by the lifting mechanism during pulling the plurality of crystal rods to adjust a distance between the crucible and the draft tube.

\* \* \* \* \*